United States Patent
Yang

(10) Patent No.: US 10,177,754 B2
(45) Date of Patent: Jan. 8, 2019

(54) METHOD AND APPARATUS FOR GENERATING PWM SIGNAL

(71) Applicant: LSIS CO., LTD., Anyang-si, Gyeonggi-do (KR)

(72) Inventor: Jin-Kyu Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 124 days.

(21) Appl. No.: 15/357,541

(22) Filed: Nov. 21, 2016

(65) Prior Publication Data
US 2017/0244399 A1      Aug. 24, 2017

(30) Foreign Application Priority Data

Feb. 18, 2016  (KR) .................. 10-2016-0019374

(51) Int. Cl.
| | |
|---|---|
| *H03K 3/017* | (2006.01) |
| *H03K 7/08* | (2006.01) |
| *H02M 7/5395* | (2006.01) |
| *H02P 27/08* | (2006.01) |
| *H02M 7/5387* | (2007.01) |

(52) U.S. Cl.
CPC .......... *H03K 7/08* (2013.01); *H02M 7/5387* (2013.01); *H02M 7/5395* (2013.01); *H02M 7/53871* (2013.01); *H02P 27/08* (2013.01)

(58) Field of Classification Search
CPC .... H02M 3/07; H02M 2003/075; G06F 3/044
See application file for complete search history.

(56) References Cited

U.S. PATENT DOCUMENTS

| | | | | |
|---|---|---|---|---|
| 5,706,186 | A * | 1/1998 | Blasko | ............. H02M 7/53875 363/41 |
| 7,130,346 | B2 | 10/2006 | Midya et al. | |
| 2013/0317630 | A1 | 11/2013 | Schulz et al. | |
| 2014/0268967 | A1 | 9/2014 | White et al. | |

FOREIGN PATENT DOCUMENTS

| | | |
|---|---|---|
| JP | 2003-284350 A | 10/2003 |
| KR | 2001-0073638 A | 8/2001 |
| KR | 10-2011-0029776 A | 3/2011 |
| KR | 10-1284923 B1 | 7/2013 |
| KR | 101284923 B1 | 7/2013 |
| KR | 10-2014-0013863 A | 2/2014 |
| KR | 10-2014-0037081 A | 3/2014 |
| KR | 1020150004025 A | 1/2015 |
| WO | 93/22828 | 11/1993 |

OTHER PUBLICATIONS

Korean office action dated Jan. 6, 2017 for corresponding KR application 1020160019374.
Extended Search Report dated Apr. 25, 2017 issued in corresponding European Application No. 16193040.9.
Kim, et al., "A New Discontinuous PWM Strategy of Neutral-Point Clamped Inverter", 2013 IEEE Industry Applications Society Annual Meeting, vol. 3, Jan. 2000.
European Office Action for related European Application No. 16193040. 9; dated Mar. 21, 2018; (7 pages).

* cited by examiner

*Primary Examiner* — Sibin Chen
(74) *Attorney, Agent, or Firm* — K&L Gates LLP

(57) ABSTRACT

Disclosed herein are a method and an apparatus for generating a random PWM voltage reference signal for driving an inverter, which can more simply generate random position PWM (RPPWM) in which a position of an active vector is changed to achieve the same effect as when a switching frequency is changed.

8 Claims, 5 Drawing Sheets

PRIOR ART

METHOD AND APPARATUS FOR GENERATING PWM SIGNAL

CROSS REFERENCE TO RELATED APPLICATION

This application claims the benefit of Korean Patent Application No. 10-2016-0019374, filed on Feb. 18, 2016, entitled "METHOD AND APPARATUS FOR GENERATING PWM SIGNAL", which is hereby incorporated by reference in its entirety into this application.

BACKGROUND

1. Technical Field

The present disclosure relates to a method and an apparatus for generating a PWM signal. More specifically, the present disclosure relates to a method and an apparatus for generating a random PWM voltage reference signal for driving an inverter, which can more simply generate random position PWM (RPPWM) in which a position of an active vector is changed to achieve the same effect as when a switching frequency is changed.

2. Description of the Related Art

In the case where an inverter is driven by a PWM signal having a fixed frequency, voltage and current are concentrated on a multiplied frequency of the switching frequency. As a result, there is a problem in that noise of a particular frequency is created.

In order to solve the problem, a random PWM scheme that varies the switching frequency has been proposed. The schemes for implementing such random PWM may include random frequency PWM (RFPWM) that varies the frequency of a triangle wave itself, random position PWM (RPPWM) that varies the position of an active vector, random switching PWM (RSPWM) that generates a random number of pulses, and the like.

Among these, in the RFPWM scheme, the frequency of a triangle wave itself is randomly varied.

When the current of a general-purpose inverter is measured, a triangle wave is sampled at its peak or zero. Accordingly, whenever the frequency of a triangle wave is changed, sampling timing is changed at every period.

Since a fixed switching frequency has a constant period of a triangle wave in operation processes necessary for reference frame conversion, it is may not necessary to calculate calculation periods at every PWM period. However, when the frequency of a triangle itself is changed such as in RFWPM scheme, calculation periods are changed at every period and thus are calculated at every period of a PWM signal. As a result, there are many considerations in programming, and calculation time also increases.

In view of the above, according to an exemplary embodiment of the present disclosure, RPPWM can be implemented more simply, such that it can be widely applied to general inverters and reduce electromagnetic noise of inverters effectively.

SUMMARY

It is an aspect of the present disclosure to provide a method and an apparatus for generating a random PWM voltage reference signal for driving an inverter, which can more simply generate random position PWM (RPPWM) in which a position of an active vector is changed to achieve the same effect as when a switching frequency is changed.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a method for generating a PWM voltage reference signal for driving inverters includes: calculating reference values from three phase voltage references to provide them; generating random variables for each of periods of the voltage reference; and applying compensation values generated by using the random variables at every period of the voltage references on the reference values to generate a random PWM voltage reference.

The method may further include: scaling the random variable so that a sum of the compensation value and the reference value is located within a range between a maximum limit and a minimum limit of the reference value.

The scaling may include scaling the random variables so that the offset values are located in a range between the maximum value of the reference value and the maximum limit of the reference level or a range between the minimum value of the reference value and the minimum limit of the reference value.

The maximum value and the minimum value of the reference value used for scaling the random variables may be obtained from Equation below:

$$V_{max}^* + v_{sn} = -(V_{min}^* + v_{sn})$$

$$v_{sn} = -\frac{V_{max}^* + V_{min}^*}{2}$$

According to an exemplary embodiment of the present disclosure, a random PWM voltage reference signal can be generated more simply by performing a PWM calculation with minimum and maximum voltage values that is a modulation scheme maximizing the voltage utilization, such that there are many advantages in that it can be widely applied to general inverters and reduce electromagnetic noise of inverters effectively.

DETAILED DESCRIPTION

Figure 1:
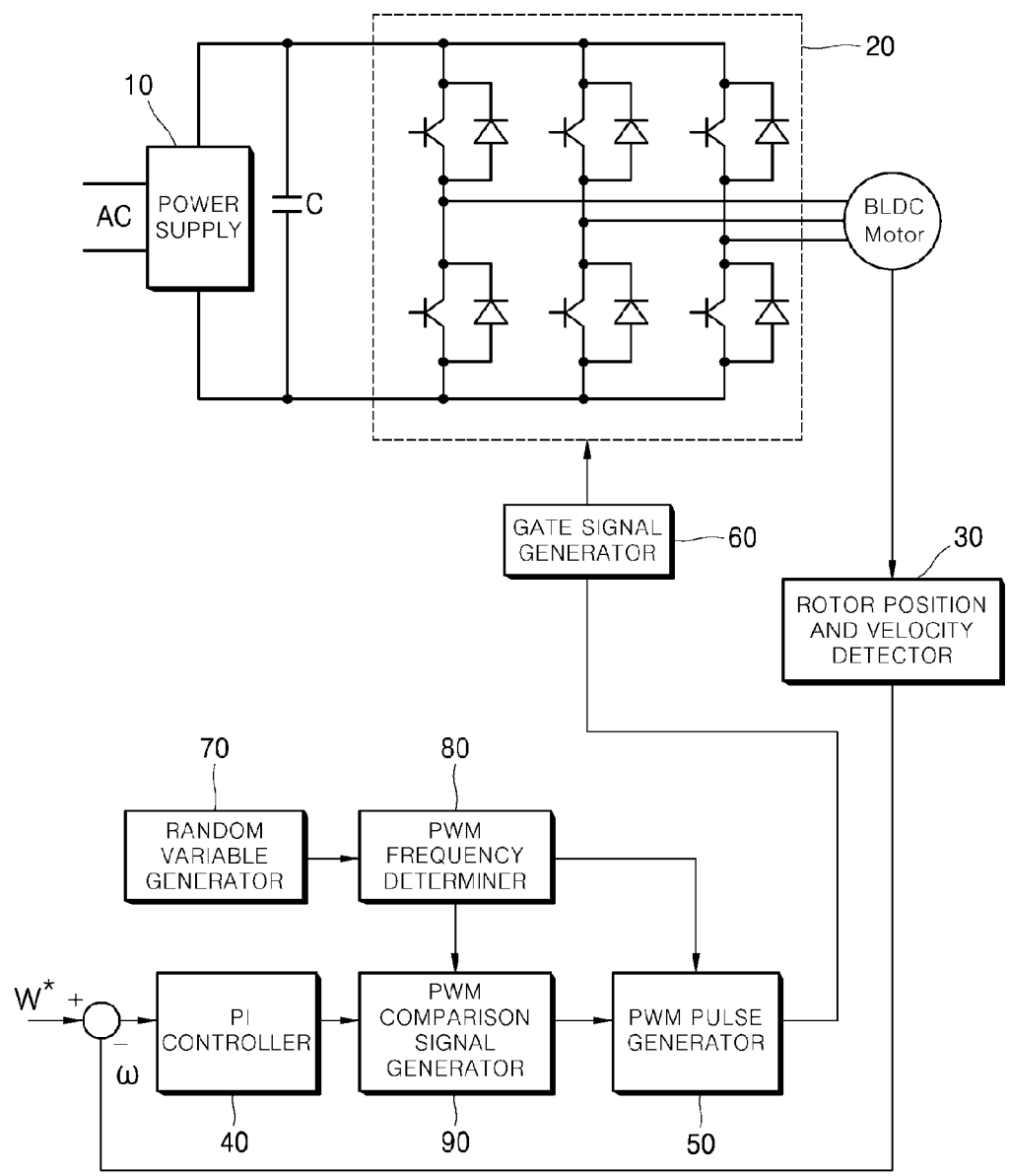
FIG. 1 is a diagram for illustrating a configuration of a compressor employing an apparatus for generating a random PWM signal in the related art.

The above objects, features and advantages will become apparent from the detailed description with reference to the accompanying drawings. Embodiments are described in sufficient detail to enable those skilled in the art in the art to easily practice the technical idea of the present disclosure. Detailed disclosures of well known functions or configurations may be omitted in order not to unnecessarily obscure the gist of the present disclosure.

Hereinafter, embodiments of the present disclosure will be described in detail with reference to the accompanying drawings. Throughout the drawings, like reference numerals refer to like elements.

FIG. 1 is a diagram for illustrating a configuration of a compressor employing an apparatus for generating a random PWM signal in the related art.

Referring to FIG. 1, the apparatus for generating a PWM signal includes a power supply 10, an inverter unit 20, a rotor position and speed detector 30, a proportional integration (PI) controller 40, a PWM pulse generator 50, a gate signal generator 60, a random variable generator 70, a PWM frequency determiner 80, a PWM comparison signal generator 90, and so on.

The power supply 10, upon receiving AC power, supplies voltages as required by the respective elements. The inverter unit 20 receives the voltages from the power supply 10 and drives a BLDC motor according to a control signal input thereto.

The rotor position and velocity detector 30 detects the position of the rotor of the BLDC motor and calculates the velocity to output it. The PI controller 40 performs proportional integration on the difference between a reference value W* and the rotation velocity ω detected by the detector 30 and adjusts the duty ratio of the PWM.

The random variable generator 70 generates random variables for generating random PWM. The PWM frequency determiner 80 determines a PWM frequency based on the random variables generated in the random variable generator 70 to output it.

The PWM comparison signal generator 90 receives a duty ratio from the PI integrator 40 and a PWM frequency from the PWM frequency determiner 80 to determine the period and on-time of the PWM frequency, and output them. The PWM pulse generator 50 uses the period and the on-time of the PWM frequency generated in the PWM comparison signal generator 90 to generate a PWM pulse, and output it.

The gate signal generator 60 generates a gate signal to turn on/off switching elements of the inverter unit 20 by the PWM pulses generated in the PWM pulse generator 50.

A typical fixed switching frequency inverter does not include the random variable generator 70 and the PWM frequency determiner 80, and receives AC power from the power supply 10 to convert it to voltages as required by the inverter unit 20. Then, six switching elements in the inverter unit 20 are connected or disconnected, such that a three-phase voltage is supplied to the motor. As the motor rotates, the position and velocity detector 30 detects the velocity. The PI controller 40 performs proportional integration on the reference velocity W* and the current velocity ω to calculate the duty ratio of the PWM. Then, it is sent to the PWM comparison signal generator 90.

For the random switching frequency inverter, the random variable generator 70 generates random variables. Accordingly, the PWM frequency determiner 80 determines the period T of the PWM switching frequency between a predetermined maximum and minimum frequencies and outputs it to the PWM comparison signal generator 90.

The PWM comparison signal generator 90 compares the duty ratio received from the PI controller 40 with the period of the PWM switching frequency received from the PWM frequency determiner 80, to determine the period and on-time of the PWM switching frequency. Then, the PWM comparison signal generator 90 sends them to the PWM pulse generator 50.

The PWM pulse generator 50 uses the PWM switching frequency and its period and on-time to generate PWM pulses for controlling the switching elements of the inverter unit 20 and sends them to the gate signal generator 60. The gate signal generator 60 receives the PWM pulses sent from the PWM pulse generator 50 to connect/disconnect the switching elements of the inverter unit 20, and supplies the three-phase voltage to the motor.

However, as described above, the frequency of a triangle wave itself is changed in RFPWM scheme, calculation periods are changed at every period and thus are calculated at every period of a PWM signal. As a result, there are many considerations in programming, and calculation time also increases.

In view of the above, the present disclosure proposes a novel approach that can generate a random PWM signal more simply and conveniently by improving the configuration and functionality of the PWM pulse generator 50.

Figure 2:
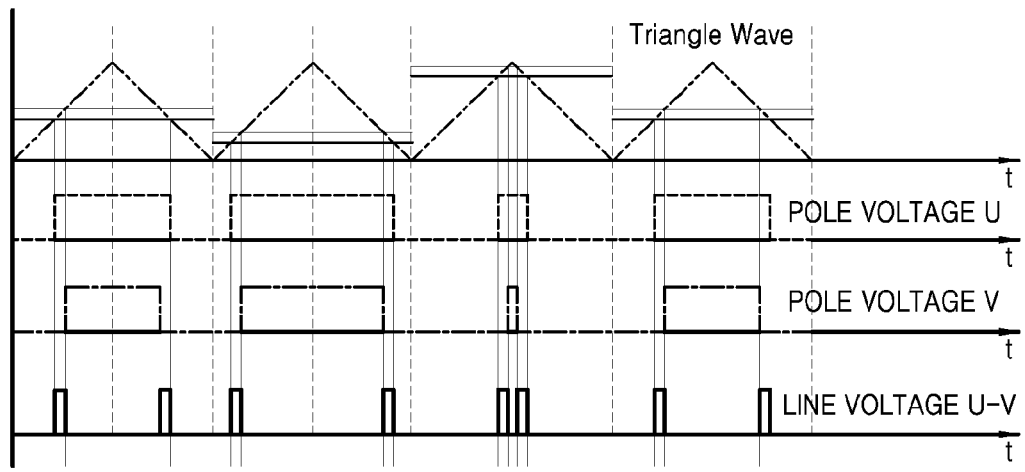
FIGS. 2 and 3 are diagrams for illustrating a method for generating a random PWM voltage reference signal according to an exemplary embodiment of the present disclosure.
Figure 3:
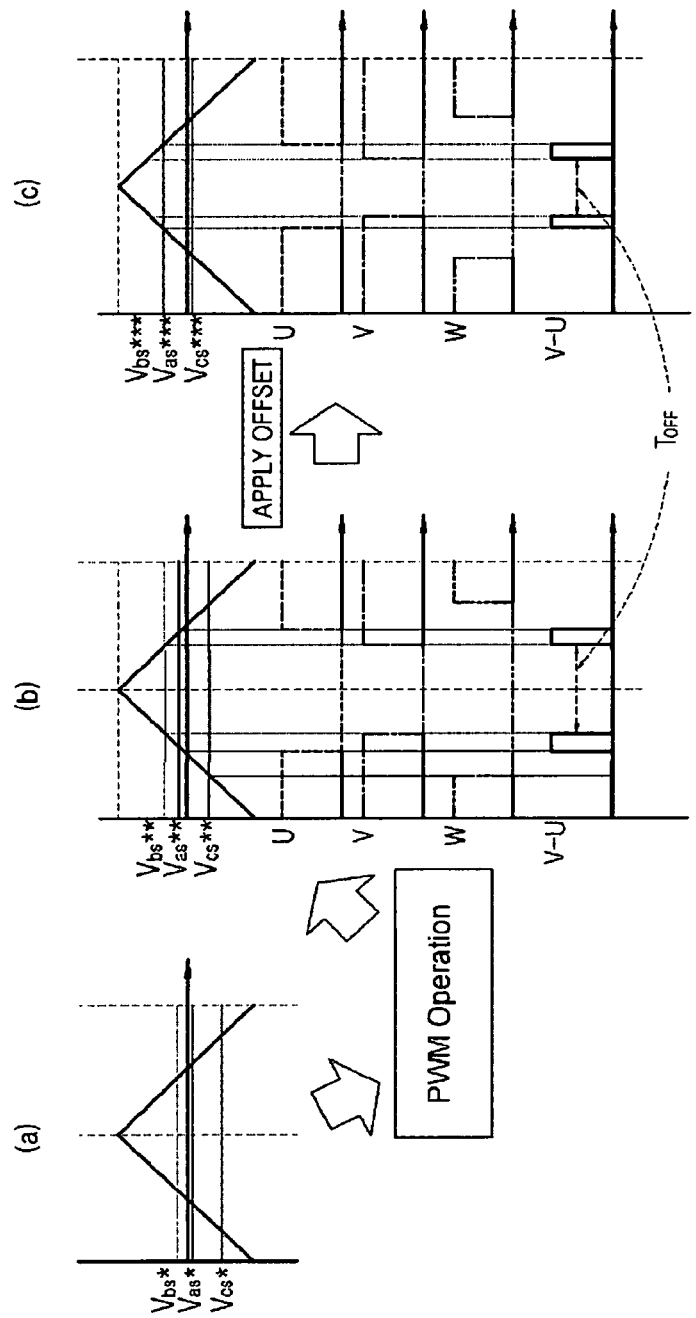

FIGS. 2 and 3 are diagrams for illustrating a method for generating a random PWM voltage reference signal according to an exemplary embodiment of the present disclosure.

As mentioned earlier, the present disclosure relates to a method for achieving random PWM by RPPWM scheme, in which switching frequency is randomly changed, unlike existing methods. That is, RPPWM scheme uses a fixed switching frequency and thus does not require a process of synchronizing a triangle wave operation and the operations required by RPPWM scheme shown in FIG. 1. In particular, the present disclosure provides a novel RPPWM technique by simply adding a randomly-generated compensation value to an existing algorithm for performing a PWM calculation using minimum and maximum voltage values.

Initially, FIG. 2 shows a triangle wave generated with a constant frequency along time (t) axis, reference voltages of U-phase and V-phase of a three-phase voltage, and a line voltage (U-V) corresponding to the difference therebetween.

The reference voltage is a voltage signal for controlling an output voltage from an inverter by using a feedback value such as velocity information or current information of a motor. For example, referring to FIG. 1, the PI controller 40 may output a reference voltage by using the velocity information W* of the motor. In the following descriptions, "reference voltage," "voltage reference," "reference signal" and "voltage reference signal" and the like are used as having the same meaning unless specifically stated otherwise.

Since the current supplied into the motor is determined by the line voltage, and thus the line voltage (U-V) is physically meaningful.

Although the line voltage, i.e., the difference between the U-phase voltage and the V-phase voltage is maintained constant throughout the periods of the triangle wave, whereas the offset value OFFSET varies randomly, which is to be added to the U and V values. Accordingly, it can be seen from FIG. 2 that the positions of pulses of the line voltage vary among different periods. In other words, the line voltage pulses concentrate on the center of a PWM period when the offset value becomes large, while the line voltage pulses are located at edges of a PWM period when the offset value becomes small.

Accordingly, by varying the offset value at every period, the positions of the line voltage pulses change in each of the triangle wave. As a result, the same effect can be achieved as when the switching frequency is changed. That is, by generating random variables and using them as the offset values, the positions of the line voltage pulses can be randomly changed among different periods of the triangle wave.

In this case, however, the output value, i.e., the sum of the applied reference value and the offset value may exceed the maximum limit value of the reference value (the peak of the triangle wave). When this happens, there is a problem in that only the maximum limit value of the reference value is output over and over, such that random switching effects may not be achieved.

Accordingly, it is necessary to scale the offset values so that the sum is located in the range between the maximum limit and the minimum limit of the reference value. That is, the maximum limit and minimum limit of the reference value are fixed, while the reference value itself may vary among different periods. Therefore, in order to maintain the output value in an appropriate range, the random variables to be used as the offset values have to be changed accordingly by scaling.

As shown in the drawing, the distance between the maximum reference value and the peak of the triangle wave (maximum limit value), and the distance between the minimum reference value and the trough of the triangle wave (minimum limit value) vary among different periods. Accordingly, in order to calculate the range within which the positions of the pulses may change, the two distances have to be calculated at every period.

However, calculating the range of the random offset based on the maximum and minimum values of a triangle wave at every period requires complicated calculation process, and thus there is a problem that the calculation time is increased.

Accordingly, it may be contemplated to use a method shown in FIG. 3.

Referring to FIG. 3, by determining the reference values $V_{bs}^*$, $V_{as}^*$, $V_{cs}^*$ output from the PI controller and the like (see FIG. 3(a)) and performing a PWM operation using minimum and maximum voltage values on the values, the average of the maximum reference value and the minimum reference value $(V_{bs}^*+V_{cs}^*)/2$ is located in the center of the triangle wave (see FIG. 3(b)). If the absolute values of the maximum reference value $V^*_{max}$ and the minimum reference value $V^*_{min}$ of the three phase voltage references are equal to each other, the active voltage vector depending on the switching state as a result of comparison with the triangle wave is located in the very center of the period of voltage modulation. By using the principle, it is possible to implement existing symmetric space vector voltage modulation technique more simply (see "Unified analysis of PWM method for three phase voltage source inverter using offset voltage" by Dae-woong Jung, Ph.D. dissertation, Seoul National University in February 2000). That is, by performing a PWM operation using minimum and maximum voltage values, adjusted reference values Vbs, Vas, Vcs** can be obtained, such that the maximum reference value $V_{bs}^*$ and the minimum reference value $V_{cs}^*$ are equally distant from the center of the triangle wave. It can be seen that the voltage modulation scheme can be achieved more simply by using such adjusted reference values.

The PWM operation using minimum and maximum voltage values may be expressed in Equation 1 below:

$$V_{max}^* + v_{sn} = -(V_{min}^* + v_{sn})$$ [Equation 1]

-continued
$$v_{sn} = -\frac{V_{max}^* + V_{min}^*}{2}$$

An arbitrary value $V_{sn}$ may be determined so that the absolute value of the maximum reference value $V^*_{max}$ becomes equal to that of the minimum reference value $V^*_{min}$ when the arbitrary value $V_{sn}$ is added thereto. It can be seen from Equation 1 that the arbitrary value Vsn thus determined is the average $(V^*_{max}+V^*_{min})/2$ of the maximum reference value and the minimum reference value.

Accordingly, as the average of the maximum reference value and the minimum reference value is located in the center of the triangle wave, the maximum reference value and the may include reference value are equally distant from the center of the triangle wave, such that the relationship $V^*_{max}=-V^*_{min}$ is established.

In other words, by performing a PWM operation with minimum and maximum values, the distance between the maximum reference value and the maximum value of the triangle wave corresponding to the maximum limit of the reference value becomes equal to the distance between the minimum reference value and the minimum value of the triangle wave corresponding to the minimum limit value of the reference value. Accordingly, the variation range between the maximum reference value and the maximum value of the triangle wave or between the minimum reference value and the minimum value of the triangle wave is calculated to determine an offset value, and "+/−" conversion is performed on it, such that output values randomly generated within a range that does not exceed the maximum limit value and the minimum limit value of the reference value.

It can be seen from FIG. 3(c) that the line voltage (U-V) obtained from the reference values $V_{bs}^{*}$, $V_{as}^{*}$, $V_{cs}^{***}$ to which an arbitrary offset value is applied is different from the previous line voltage (as indicated by $T_{OFF}$) due to the influence of the offset value.

In FIG. 3 and Equation 1, $V_{as}^*$, $V_{bs}^*$, $V_{cs}^*$ denotes the reference values calculated from the applied three-phase voltage reference, $V_{as}^{}$, $V_{bs}^{}$, $V_{cs}^{}$ denotes adjusted reference values obtained by performing the PWM operation using minimum and maximum voltage values on the three phase reference values, respectively. Further, $V_{as}^{*}$, $V_{bs}^{*}$, $V_{cs}^{*}$ denotes output values obtained by applying the offset value to the adjusted reference values.

Figure 4:
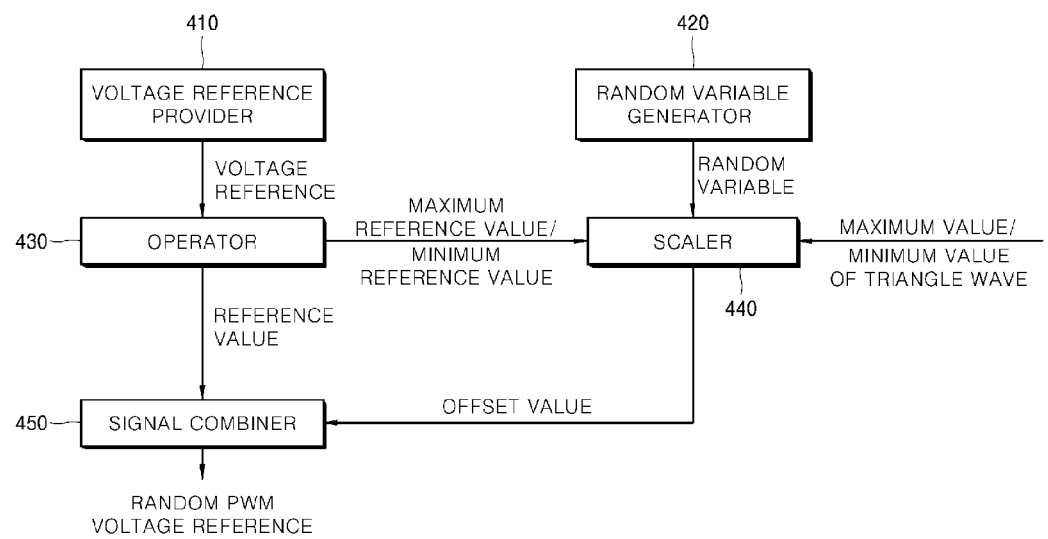
FIG. 4 is a block diagram for illustrating an apparatus for generating a random PWM voltage reference signal according to an exemplary embodiment of the present disclosure.

FIG. 4 is a block diagram for illustrating an apparatus for generating a random PWM voltage reference signal according to an exemplary embodiment of the present disclosure.

Referring to FIG. 4, the apparatus for generating a random PWM voltage reference signal according to the exemplary embodiment of the present disclosure includes a voltage reference provider 410, a random variable generator 420, an operator 430, a scaler 440, a signal combiner 450 and the like.

The voltage reference provider 410 provides ordinary three-phase voltage references. The random variable generator 420 generates random variables applied as offset values at every period of a voltage reference. Alternatively, the random variable generator 420 may generate random variables at every natural number multiple of the period of a voltage reference. In this case, random variables generated in a period corresponding to the period of the voltage reference may be selectively used.

It is to be understood that any of well known random variable generating techniques such as mid-square method and linear congruential method may be applied to the random variable generator 420.

The operator 430 performs a PWM operation using minimum and maximum voltage values by using a current voltage reference sent from the voltage reference provider 410. The scaler 440 scales the random variables with a range set from the maximum value or the minimum value of the adjusted reference values calculated via the PWM operation using minimum and maximum voltage values and the maximum value or the minimum value of the triangle wave, thereby generating an offset value.

For example, let us assume that the random variables are generated as numbers within a predetermined range (e.g., 1 to 100) and the ranges set by the maximum value of adjusted reference values and the maximum value of a triangle wave during three periods of the triangle wave are 8, 10 and 15, respectively. If the random variable in the first period of the triangle wave is 80, a scaling ratio of 8*(80/100) may be applied. Accordingly, the offset value is approximately 6.

Subsequently, if the random variable in the second period of the triangle wave is 50, a scaling ratio of 10*(50/100) may be applied. Accordingly, the offset value is 5. If the random variable in the third period of the triangle wave is 25, the offset value is approximately 4.

That is, the random variables generated by the random variable generator 420 may be created as offset values falling within in the ranges set by the scaler 440. Then, the offset values and the adjusted reference values may be combined by the signal combiner 450, such that a random PWM voltage reference can be generated.

In other words, the operator 430 performs MinMaxPWM operation on the voltage references provided from the voltage reference provider 410 to obtain the adjusted reference values, and the adjusted reference values are delivered to the scaler 44 and the signal combiner 450. Then, the adjusted reference values delivered to the scaler 440 are used to scale the random variables generated by the random variable generator 420. Then, the offset values generated by scaling the random variables are combined with the adjusted reference values by the signal combiner 450, such that the random PWM voltage reference signal varying among different periods can be generated.

That is, as described above, by performing MinMaxPWM operation on the voltage references provided from the voltage reference provider 410 by the operator 430, the maximum reference value and the minimum reference value can be equally distant from the center of the triangle wave. By doing so, the active vector may be applied in a section between the maximum reference value and the maximum value of the triangle wave and between the minimum reference value and the minimum value of the triangle wave. Accordingly, the scaler 440 performs scaling so that the random variables generated by the random variable generator 420 are located in the section, and accordingly the offset values are created from the scaling and are applied to the adjusted reference values provided from the operator 430, thereby creating the random PWM reference signal.

Preferably, when the scaler 440 uses a middle maximum reference value among results of the PWM operation using minimum and maximum voltage values to generate offset values, the maximum value of the triangle wave may be used. On the other hand, when the minimum reference value is used, the minimum value of the triangle wave may preferably be used.

As described above, the PWM operation using minimum and maximum voltage values may be carried out according to Equation 1.

Figure 5:
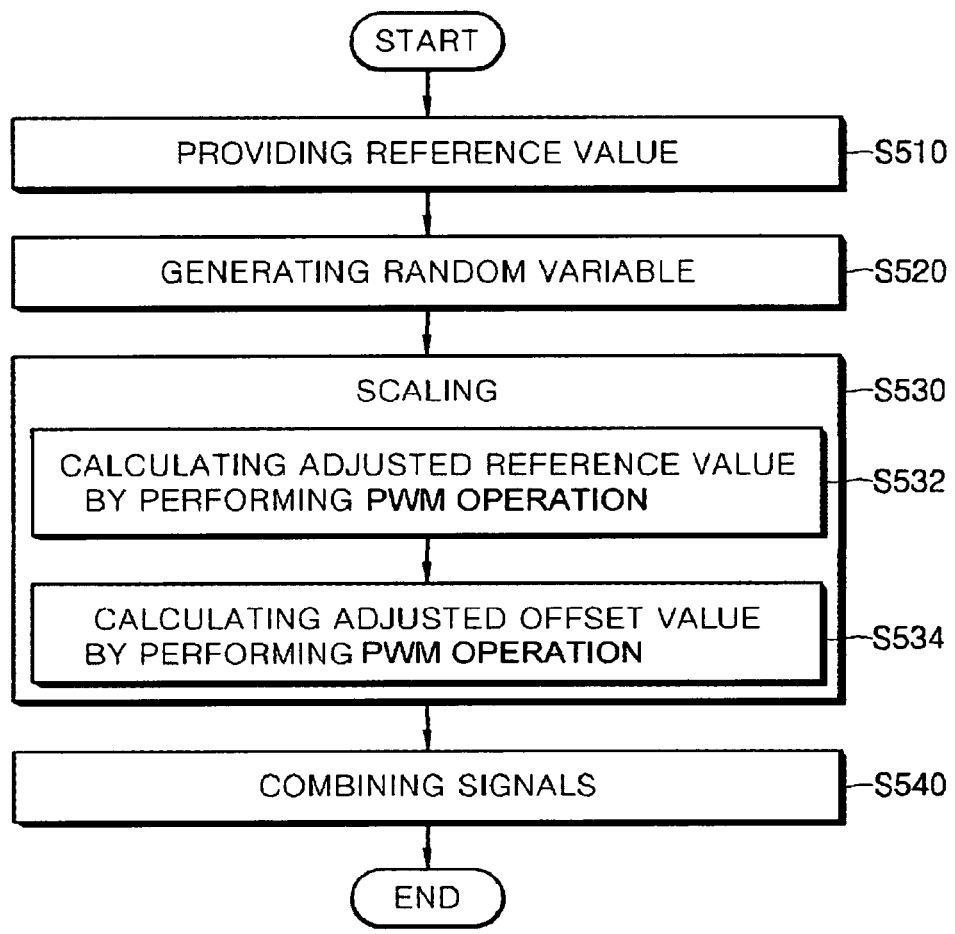
FIG. 5 is a flowchart for illustrating a method for generating a random PWM voltage reference signal according to an exemplary embodiment of the present disclosure.

FIG. 5 is a flowchart for illustrating a method for generating a random PWM voltage reference signal according to an exemplary embodiment of the present disclosure.

Referring to FIG. 5, the method for generating a random PWM voltage reference signal according to the exemplary embodiment of the present disclosure includes providing reference values S510, generating random variables S520, scaling S530, and combining signals S540 and the like.

The providing S510 provides three phase voltage references having a constant frequency. The generating S520 generates random variables for each of the periods of the voltage references.

The scaling S530 includes calculating adjusted reference values by performing a PWM operation using minimum and maximum voltage values on the voltage references sent from the providing S510 (step S532). In addition, the scaling S530 includes generating offset values by scaling the random variables within a range formed by the difference between the maximum reference value or the minimum reference value of the adjusted reference value and the maximum value or the minimum value of the triangle wave (step S534)

That is, by performing the scaling S530, offset values can be generated so that the output value as combination of the reference values and the offset values is located within a range between the maximum value and the minimum value of the triangle wave that are the maximum limit and the minimum limit of the reference values.

The offset values thus generated are combined with the adjusted reference values via the combining S540, such that a real-time random PWM voltage reference signal can be generated.

As described above, exemplary embodiments of the present disclosure relate to a method for implementing a random PWM that does not require synchronization process among triangle wave operation or operations. In particular, by simply adding random offset values generated by using the PWM operation using minimum and maximum voltage values, a random PWM region signal can be generated efficiently, which is already described above.

According to an exemplary embodiment of the present disclosure, a random PWM voltage reference signal can be generated more simply by using a PWM operation with minimum and maximum voltage values that is a modulation scheme maximizing the voltage utilization, such that it can be widely applied to general inverters and reduce electromagnetic noise of inverters effectively.

The exemplary embodiments of the present disclosure described above may be substituted, altered, and modified by those skilled in the art without departing from the scope and sprit of the present disclosure. Therefore, the present disclosure is not limited to the above-mentioned exemplary embodiments and the accompanying drawings.

What is claimed is:

1. An apparatus for generating a PWM voltage reference signal, the apparatus comprising:
a voltage reference provider configured to calculate reference values from three-phase voltage references;
a random variable generator configured to generate random variables;
an operator configured to perform a PWM operation using minimum and maximum voltage values on a current voltage reference of the reference values sent from the voltage reference provider to calculate adjusted reference values;
a scaler configured to scale the random variables by a range set by a maximum value or a minimum value of the adjusted reference values and a maximum limit or a minimum limit of the adjusted reference values to generate compensation values; and a signal combiner configured to combine the adjusted reference values and the compensation values to generate the PWM voltage reference signal.

2. The apparatus of claim 1, wherein the PWM operation is carried out by $$V^*_{max} + v_{sn} = -(V^*_{min} + v_{sn})$$
$$v_{sn} = -\frac{V^*_{max} + V^*_{min}}{2},$$

wherein the $V^*_{max}$ is a maximum reference value, the $V^*_{min}$ is a minimum reference value, and $v_{sn}$ is an arbitrary value.

3. The apparatus of claim 2, wherein the scaler scales the random variables so that a sum of the maximum value or the minimum value of the adjusted reference values obtained from the PWM operation and a maximum value or minimum value of a triangle wave does not exceed the maximum limit and the minimum limit of the adjusted reference values.

4. The apparatus of claim 1, wherein the random variable generator generates the random variables for each period of the three-phase voltage reference.

5. A method for generating a PWM voltage reference signal, the method comprising:

calculating, with a voltage reference provider, reference values from three-phase voltage references;

generating, with a random variable generator, random variables;

applying, with a signal combiner, compensation values generated by using the random variables at every period of the three-phase voltage references on the reference values to generate the PWM voltage reference signal; and scaling, with a scaler, the random variables so that a sum of the compensation values and the reference values is located within a range between a maximum limit and a minimum limit of the reference values;

wherein the maximum and the minimum of the reference values used for scaling the random variables are obtained by performing, with an operator, a PWM operation using minimum and maximum voltage values.

6. The method of claim 5, wherein the PWM operation is carried out by $$V^*_{max} + v_{sn} = -(V^*_{min} + v_{sn})$$
$$v_{sn} = -\frac{V^*_{max} + V^*_{min}}{2},$$

wherein $V^*_{max}$ is a maximum reference value, $V^*_{min}$ is a minimum reference value, and $v_{sn}$ is an arbitrary value.

7. The method of claim 6, wherein the scaling comprises scaling, with the scaler, the random variables so that a sum of the maximum value or the minimum value of the adjusted reference values obtained from the PWM operation and a maximum value or minimum value of a triangle wave does not exceed the maximum limit and the minimum limit of the adjusted reference values.

8. The method of claim 5, wherein generating the random variables comprises generating the random variables for each period of the three-phase voltage reference.

* * * * *